US009520334B2

(12) United States Patent
Chapelon et al.

(10) Patent No.: US 9,520,334 B2
(45) Date of Patent: Dec. 13, 2016

(54) INTEGRATED STRUCTURE WITH IMPROVED HEAT DISSIPATION

(71) Applicants: STMicroelectronics SA, Montrouge (FR); STMicroelectronics (Crolles 2) SAS, Crolles (FR); Anne Lombardot, Chenia les Vernes (FR)

(72) Inventors: Laurent-Luc Chapelon, Domene (FR); Pascal Ancey, Revel (FR); Sandrine Lhostis, Theys (FR)

(73) Assignees: STMICROELECTRONICS (CROLLES 2) SAS, Crolles (FR); STMICROELECTRONICS SA, Montrouge (FR)

( * ) Notice: Subject to any disclaimer, the term of this patent is extended or adjusted under 35 U.S.C. 154(b) by 144 days.

(21) Appl. No.: 14/155,007

(22) Filed: Jan. 14, 2014

(65) Prior Publication Data

US 2014/0210071 A1 Jul. 31, 2014

(30) Foreign Application Priority Data

Jan. 30, 2013 (FR) ...................... 13 50770

(51) Int. Cl.
*H01L 23/34* (2006.01)
*H01L 23/36* (2006.01)
(Continued)

(52) U.S. Cl.
CPC .......... *H01L 23/36* (2013.01); *H01L 23/3128* (2013.01); *H01L 23/4275* (2013.01); *H01L 23/4334* (2013.01); *H01L 23/481* (2013.01); *H01L 25/0657* (2013.01); *H01L 29/0657* (2013.01); *H01L 2224/73204* (2013.01); *H01L 2225/06513* (2013.01); *H01L 2225/06517* (2013.01);
(Continued)

(58) Field of Classification Search
CPC .... H01L 23/36; H01L 23/3128; H01L 23/481; H01L 29/0657; H01L 25/0657; H01L 23/4275; H01L 23/4334; H01L 2224/73204; H01L 2225/06513; H01L 2225/06589; H01L 2225/06541; H01L 2225/06517; H01L 2225/06555
See application file for complete search history.

(56) References Cited

U.S. PATENT DOCUMENTS

| 6,683,325 B2 * | 1/2004 | Waitl | H01L 33/56 257/100 |
| 2004/0217485 A1 * | 11/2004 | Chung | H01L 21/563 257/778 |

(Continued)

FOREIGN PATENT DOCUMENTS

| EP | 1703557 A2 | 9/2006 |
| EP | 2154938 A2 | 2/2010 |

OTHER PUBLICATIONS

INPI Search Report and Written Opinion for FR 1350770 mailed Oct. 11, 2013 (12 pages).

*Primary Examiner* — Victor A Mandala
(74) *Attorney, Agent, or Firm* — Gardere Wynne Sewell, LLP

(57) ABSTRACT

An integrated structure includes a support supporting at least one chip and a heat dissipating housing, attached to the chip. The housing is thermally conductive and has a thermal expansion compatible with the chip. The housing may further including closed cavities filled with a phase change material.

27 Claims, 10 Drawing Sheets

(51) Int. Cl.
  *H01L 23/427* (2006.01)
  *H01L 23/433* (2006.01)
  *H01L 25/065* (2006.01)
  *H01L 23/31* (2006.01)
  *H01L 23/48* (2006.01)
  *H01L 29/06* (2006.01)

(52) U.S. Cl.
  CPC ............... *H01L 2225/06541* (2013.01); *H01L 2225/06555* (2013.01); *H01L 2225/06589* (2013.01)

(56) References Cited

U.S. PATENT DOCUMENTS

| | | | |
|---|---|---|---|
| 2006/0042825 A1 | 3/2006 | Lu et al. | |
| 2008/0203550 A1* | 8/2008 | Ewe | H01L 23/4334 257/675 |
| 2012/0074549 A1* | 3/2012 | Yow | H01L 23/3107 257/676 |
| 2012/0125573 A1* | 5/2012 | Rubenstein | F28D 15/00 165/104.33 |
| 2012/0126280 A1* | 5/2012 | Lee | H01L 33/642 257/99 |
| 2013/0320390 A1* | 12/2013 | Palaniswamy | H01L 33/62 257/99 |
| 2014/0361440 A1* | 12/2014 | Bar | H01L 21/76898 257/774 |
| 2015/0236002 A1* | 8/2015 | Haba | H01L 25/18 257/713 |

* cited by examiner

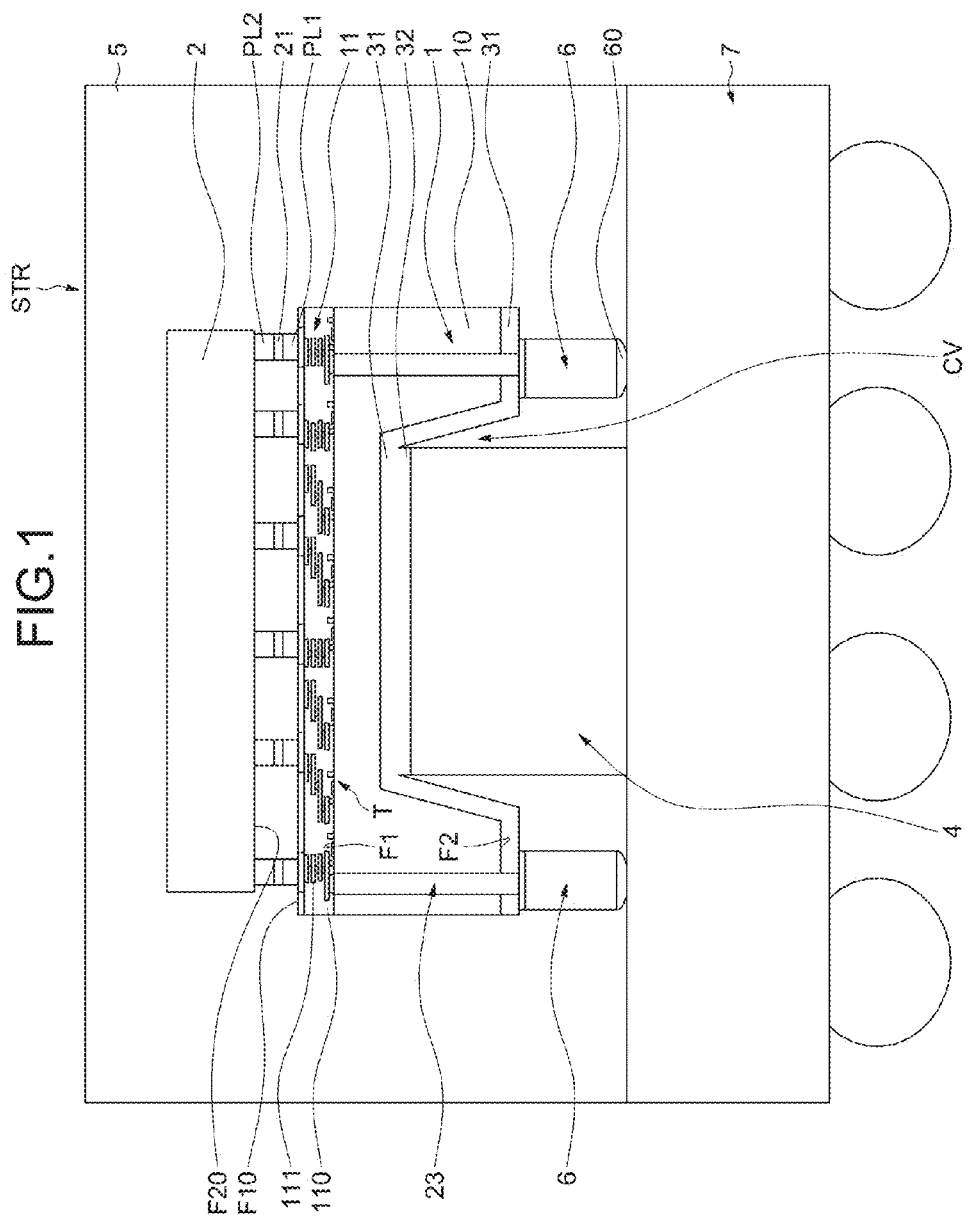

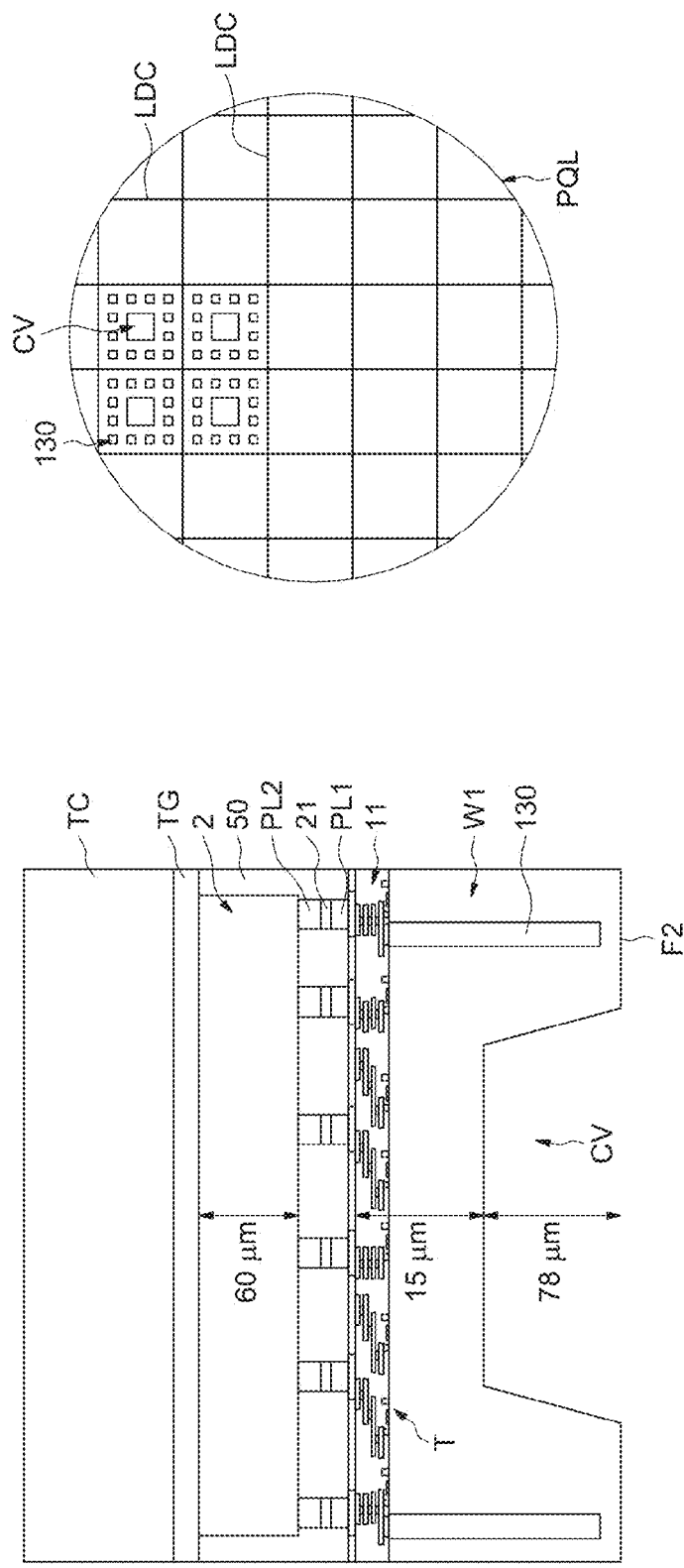

INTEGRATED STRUCTURE WITH IMPROVED HEAT DISSIPATION

PRIORITY CLAIM

This application claims priority from French Application for Patent No. 1350770 filed Jan. 30, 2013, the disclosure of which is incorporated by reference.

TECHNICAL FIELD

The invention relates to integrated circuits, notably integrated structures or multilayers, for example but not exclusively three-dimensional, and, more particularly, to the dissipation of heat inside of such structures.

BACKGROUND

In operation, the various components of the integrated circuit or the various integrated circuits or chips of the structure release heat. However, this released heat limits the power of the integrated circuit or circuits and consequently their performance, which is particularly critical in certain applications, such as for example telephony applications.

Furthermore, the intensity of the heat and the heat flows are not uniform inside of the structure, and numerous thermal obstacles, such as for example materials with a low thermal conductivity, and/or the integrated circuits themselves, limit the dissipation of heat from the structure.

SUMMARY

According to one embodiment, an integrated structure is provided having an improved heat dissipation.

According to one aspect, an integrated structure is provided, comprising a substrate, for example of the BGA (Ball Grid Array) type comprising connection microbeads allowing the structure to be soldered onto a printed circuit board, the substrate carrying at least one chip and one heat dissipating housing, attached to the chip, being thermally conducting and with a thermal expansion compatible with the chip.

The housing advantageously forms an integral part of the structure. It is consequently integratable, in particular it may be implemented by an integration process flow of the CMOS type.

Its compatibility with the chip in terms of thermal expansion notably means that, when the temperature increases, the thermal expansion of the housing preserves the integrity of the chip by notably not causing any cracking in the chip.

Those skilled in the art will notably be capable of choosing the coefficient of thermal expansion of the housing so as to be compatible with the materials typically used in the fabrication of an electronic chip in view of the application envisaged and of the expected rise in temperature during the operation of the components of the chip.

By way of example, an acceptable coefficient of thermal expansion can be in the range between 2 ppm·$K^{-1}$ and 5 ppm·$K^{-1}$.

The elasticity of the housing also contributes during thermal expansion to preserving the integrity of the structure.

By way of example, an acceptable Young's modulus for the housing can be in the range between 50 GPa and 190 GPa.

The thermal conductivity of the housing is also advantageously chosen in view of the application envisaged and of the expected increase in temperature during the operation of the components of the chip.

By way of example, the heat dissipating housing has for example a thermal conductivity in the range between 100 W·$m^{-1}$·$K^{-1}$ and 300 W·$m^{-1}$·$K^{-1}$.

According to one embodiment, the heat dissipating housing is configured for storing the heat when the electronic components of the at least one chip are in operation and for releasing the heat stored when the components are turned off.

Thus, the heat dissipating housing may contain at least one phase-change material, for example paraffin, exhibiting a first phase change during which it stores the heat and a second phase change during which it releases the stored heat.

The storage capacity in latent heat of the housing is also advantageously chosen in view of the application envisaged and of the expected increase in temperature during the operation of the components on the chip.

By way of example, an acceptable value of storage capacity in latent heat can be in the range between 0.5 J and 3.5 J for a volume of housing of thickness 250 microns and of cross section equal to 1 $cm^2$.

According to one embodiment, the heat dissipating housing comprises a body made of silicon having at least one cavity closed by a cover made of silicon and containing the phase-change material.

In such a manner as to improve the thermal conductivity, the at least one cavity and the internal face of the cover are preferably coated with a thermally conductive layer. The material used for the thermally conductive layer can advantageously be aluminum nitride (AlN). This is because such a material can be readily etched and deposited at low temperature (350° C. for example). Nevertheless, other materials may be used, such as for example SiC, without this example being exhaustive.

According to one embodiment, the housing is fixed into an open cavity of the chip formed on one of its faces, for example by an oxide/oxide bonding or else by means of a specific adhesive.

The at least one chip can be situated between the support and the heat dissipating housing.

As a variant the heat dissipating housing may be disposed between the at least one chip and the support, while being in contact with the support.

In such a manner as to further improve the thermal conductivity, a thermally conductive layer, for example of aluminum nitride (AlN), may be placed at the interface between the body of the housing and the support.

The structure can be a two-dimensional structure (2D), or else three-dimensional (3D), in other words additionally comprising at least one other chip stacked on the first chip, for example on the opposite side to the housing.

The structure may also furthermore comprise a means forming a radiator in contact with one face of the housing on the opposite side to that attached to the chip.

BRIEF DESCRIPTION OF THE DRAWINGS

Other advantages and features of the invention will become apparent upon examining the detailed description of non-limiting embodiments, and of the appended drawings in which:

FIGS. 1 to 17 relate to various embodiments of an integrated structure.

DETAILED DESCRIPTION OF THE DRAWINGS

Figure 4:
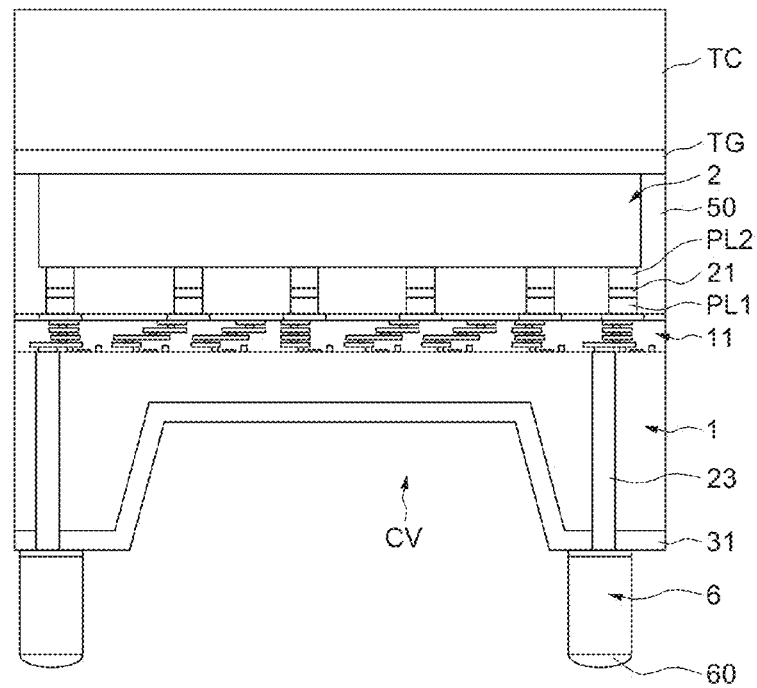

In FIG. 1, the reference STR denotes a three-dimensional integrated structure comprising two chips 1 and 2. The chip 1 comprises a substrate 10, for example made of single-crystal silicon, together with an interconnection block 11 (or BEOL) situated on top of a first face F1 of the substrate. This interconnection block comprises a stack of metallization levels and of via levels globally referenced by the reference 111, covered by an electrically-insulating region globally referenced by the reference 110. Conventionally, this interconnection block allows the interconnections to be formed between the components of the chip, for example transistors T; and/or with the contact pads here located on the front face F10 of the chip 1.

Similarly, the second chip 2 comprises a substrate together with an interconnection block (not shown here for the sake of simplification of the figure) also comprising a stack of metallization levels and of via levels covered by an electrically-insulating region.

The two chips 1 and 2 are joined together via their respective front faces F10, F20 by electrically-conductive pillars PL2, PL1, generally made of copper, joined together by means of a layer 21 of an alloy with a low melting point, for example a tin-silver-copper alloy. These pillars of copper are generally denoted by those skilled in the art under the terms of either "copper pillars" or "copper posts". Pillars of the "copper pillars" type comprise, at their free end, the alloy with a low melting point designed to form an electrical contact with the free end of the pillars of the "copper post" type.

In the embodiment illustrated here, the chip 1 also conventionally comprises several through-vias 23 also referred to by those skilled in the art using the abbreviation "TSV" (Through Silicon Vias). These through-vias 23 allow an electrical connection to be provided between the interconnection block 11 of the chip 1 and external connection means 6, for example copper pillars.

The external connection means 6 are attached, for example by soldering, to a support 7, for example of the BGA ("Ball Grid Array") type comprising microbead connections allowing the structure STR to be connected onto a printed circuit board for example.

The structure STR also comprises a heat dissipating housing 4 here disposed within a cavity CV formed on the back of the chip 1. The housing 4 is, in this embodiment, attached to the chip 1 by direct bonding between an oxide layer 31 situated on the back face of the substrate 10 and an oxide layer 32 disposed on the top face of the housing 4. These two oxides are for example layers of silicon oxynitride (SiON).

The bottom face of the housing 4 rests on the support 7.

The whole assembly is encapsulated in an encapsulation resin 5.

The housing forms an integral part of the structure. It is accordingly integratable, and may in particular be fabricated by an integration process flow of the CMOS type as will be seen in more detail hereinafter.

When the temperature increases, the thermal expansion of the housing preserves the integrity of the chip by not causing cracking in the chip.

By way of example, the housing has a coefficient of thermal expansion in the range between 2 ppm·$K^{-1}$ and 5 ppm·$K^{-1}$.

The elasticity of the housing also contributes, during thermal expansion, to preserving the integrity of the structure.

By way of example, an acceptable Young's modulus for the housing can be in the range between 50 GPa and 190 GPa.

The thermal conductivity of the housing is for example in the range between 100 W·$m^{-1}$·$K^{-1}$ and 300 W·$m^{-1}$·$K^{-1}$.

The heat dissipating housing is also advantageously configured for storing heat when the electronic components of the chips 1 and 2 are in operation and for releasing the heat stored when the components are turned off.

Thus, as will be seen in more detail hereinafter, the heat dissipating housing may contain at least one phase-change material, for example paraffin, possessing one first phase change during which it stores the heat and a second phase change during which it releases the stored heat.

The storage capacity in latent heat of the housing is advantageously chosen in view of the application envisaged and of the expected increase in temperature during the operation of the components of the chips.

By way of example, an acceptable value of storage capacity in latent heat can be in the range between 0.5 J and 3.5 J for a volume of housing of thickness 250 microns and of cross section equal to 1 $cm^2$.

The ranges of values mentioned hereinbefore relating to the corresponding parameters of the housing (coefficient of thermal expansion, to the Young's modulus, to the thermal conductivity and to the storage capacity in latent heat) allow a good heat dissipation for usual configurations of integrated structures, whether two-dimensional or three-dimensional.

However, those skilled in the art will, where necessary, know how to modify the value of at least one of these parameters outside of the corresponding range according to a particular application and to configure the housing accordingly.

Reference is now more particularly made to FIGS. 1 to 6 in order to illustrate various steps in the fabrication of the structure in FIG. 1.

In FIG. 2, the integration of the chip 1 is prepared by starting from a substrate W1 made of bulk silicon. This substrate W1 forms part of a silicon wafer PQL (FIG. 3) in which a batch of several chips 1 is simultaneously fabricated.

First of all, the part known to those skilled in the art by the term "FEOL" (Front End Of Line), incorporating the various components T of the chip, is fabricated, then in a conventional manner known per se the interconnection block (BEOL) 11 is fabricated.

In addition, prior to the fabrication of the interconnection block 11, a via 130 is formed, not opening into the substrate W1, known by those skilled in the art under the term "TSV middle".

After having carried out similar operations (FEOL and BEOL) on the upper chip 2, the pillars PL1, PL2 are formed, in a conventional manner known per se, for example by using electrochemical deposition steps. The pillars PL1 and PL2 are bonded together and the upper chip 2 is encapsulated by means of a resin 50.

Subsequently, the encapsulation is thinned in such a manner as to end up for example with a thickness of 60 microns for the chip 2.

A handle TC made of silicon is then attached, for example by means of a temporary glue TG, which then allows the assembly to be held so as to allow the substrate W1 to be thinned from the back face, and the thickness to be reduced for example to 93 microns.

Then, in each of the lower chips 1 of the wafer PQL, a cavity CV is formed that opens out on the back face F2 of the substrate W1. This cavity, with a height for example of 78 microns, is formed in a conventional manner known per se, for example by photolitho-etch steps.

The processing of the back face of the chip 1 notably comprises (FIG. 4) a localized etching of the substrate W1 at the "TSV middle" 130 (illustrated in FIG. 3), then a deposition, for example a chemical vapor-phase deposition (CVD) of the layer 31 of silicon oxynitride, having for example a thickness of 2 microns, followed by a chemical-mechanical polishing.

Conventionally, the pillars 6 coming into contact with the through-via 23 are then formed. Here again, these pillars are for example formed in a conventional manner known per se by electrochemical deposition steps and, at their end, have an alloy 60 with a low melting point with a view to fixing them onto the support 7.

Figure 5:
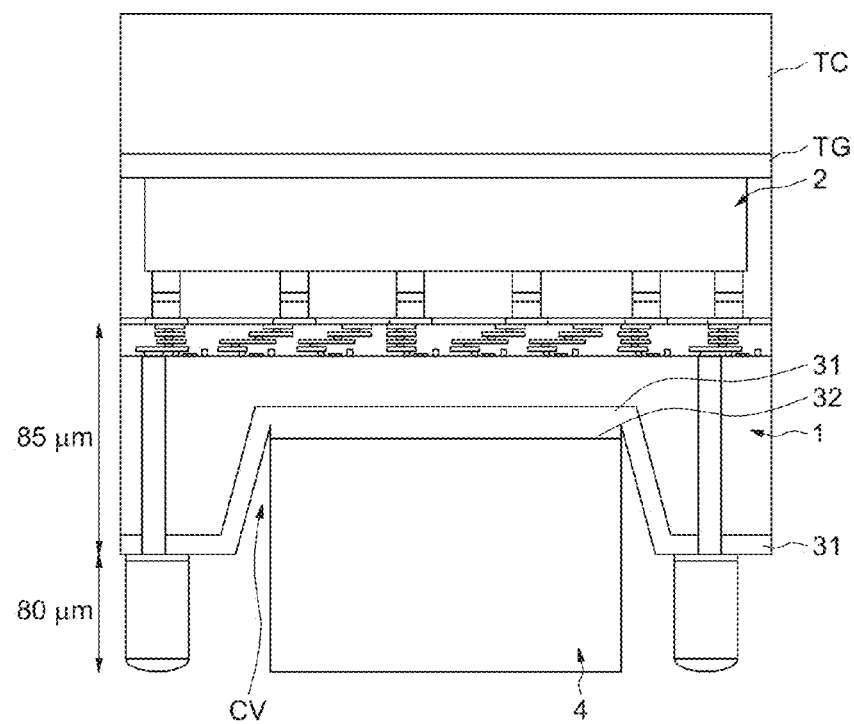
Figure 6:
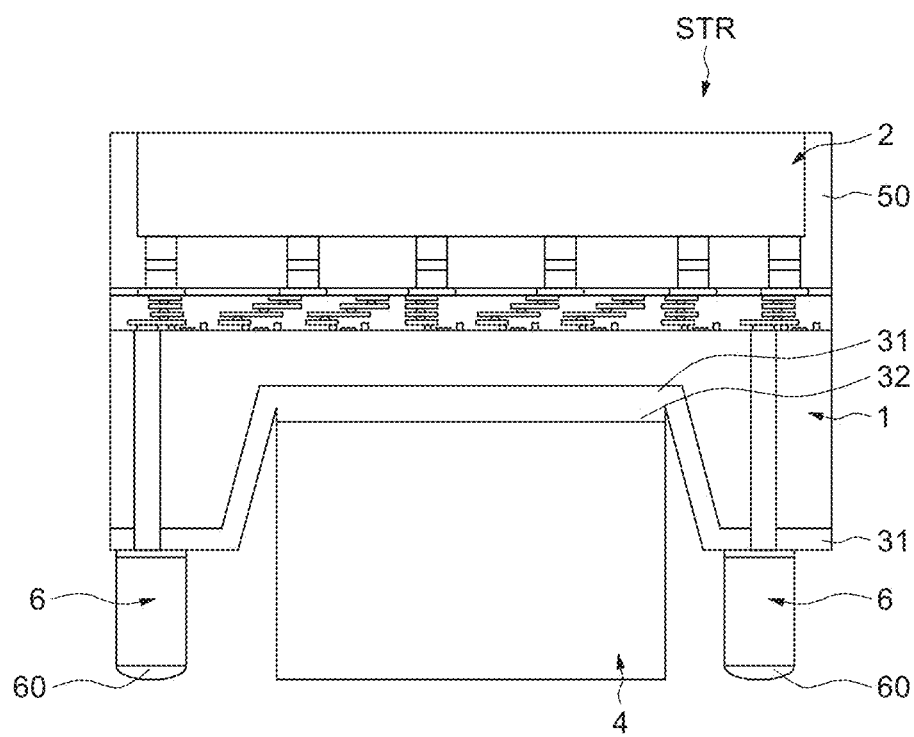

Then, as illustrated in FIG. 5, the heat dissipating housing 4 is attached to the chip 1 in the cavity CV. For this purpose, the top face of the housing 4 has the oxide layer 32, for example also silicon oxynitride. The housing 4 is then attached by a conventional direct oxide/oxide bonding (layer 32-layer 31).

Subsequently, the following is carried out (FIG. 6): the etching away of the handle TC, the cleaning of the temporary glue TG and the dicing of the wafer along the dicing lines LDC (FIG. 3).

And, after a final encapsulation in an encapsulation resin and fixing onto the support 7, the structure STR in FIG. 1 is obtained.

Figure 7:
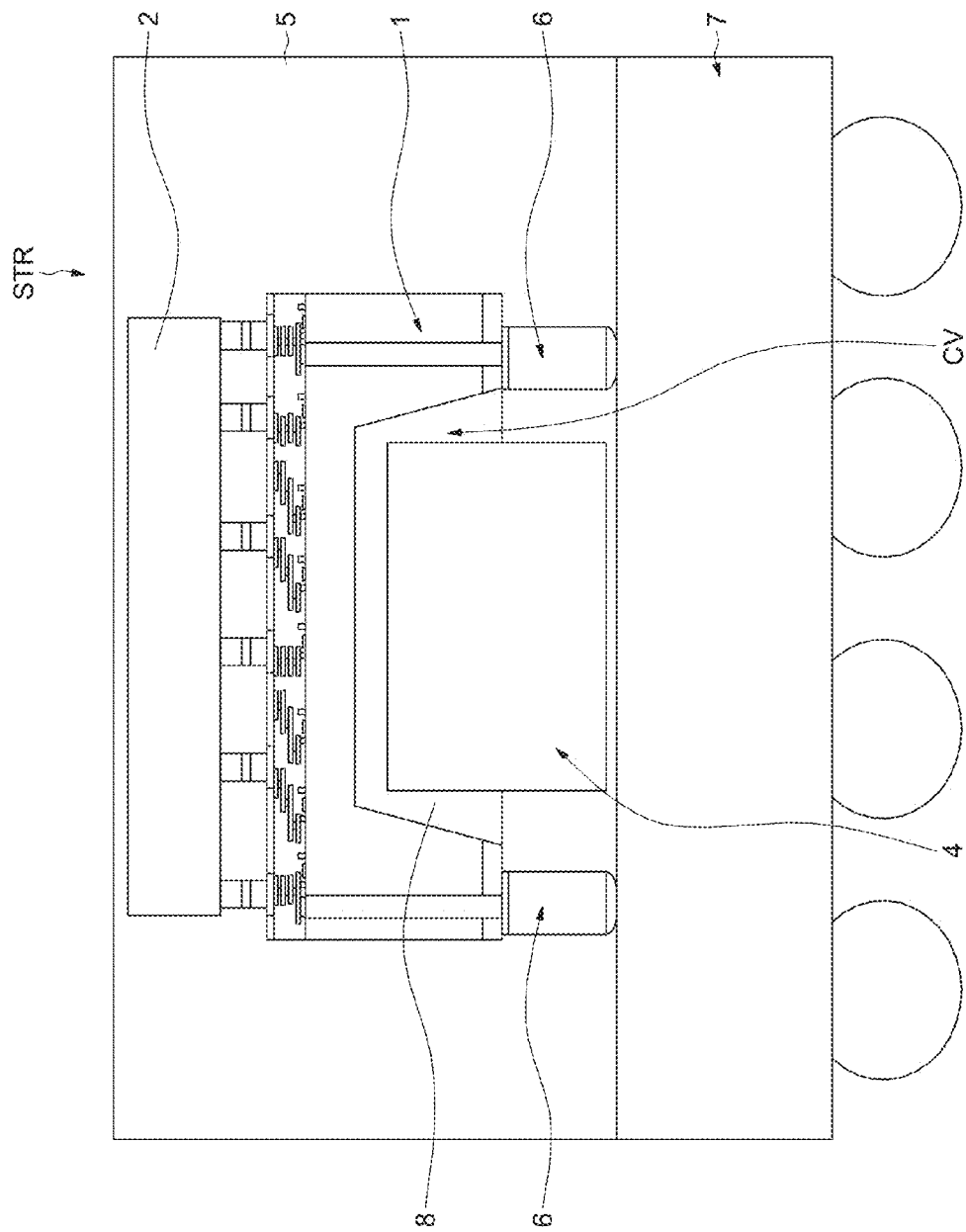

As a variant, as illustrated in FIG. 7, the heat dissipating housing 4 of the structure STR can be attached to the chip 1 by means of a layer of thermally conductive glue 8, for example containing silver, filling the space in the cavity CV situated between the housing and the substrate of the chip 1.

Other arrangements of the structure STR are possible.

Figure 8:
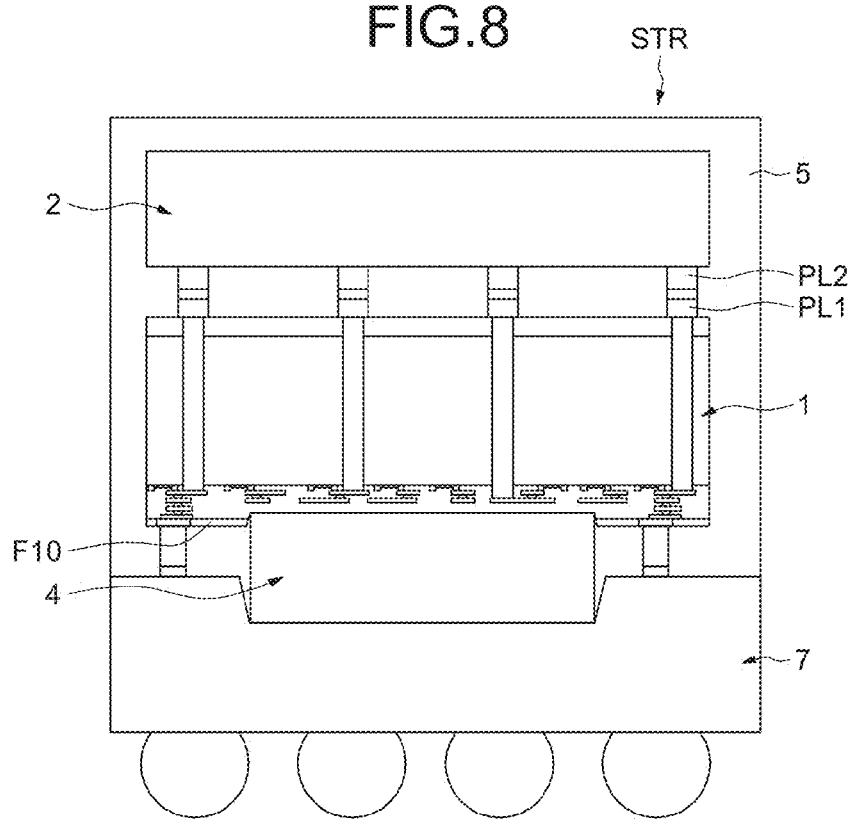

Thus, as illustrated in FIG. 8, the heat dissipating housing 4 can be fixed into a cavity this time formed in the front face F10 of the chip 1 while at the same time being in contact with the support 7 in the bottom of a cavity of this support.

The chip 2 is this time in contact, via the pillars PL2, PL1, with the back face of the chip 1.

Figure 9:
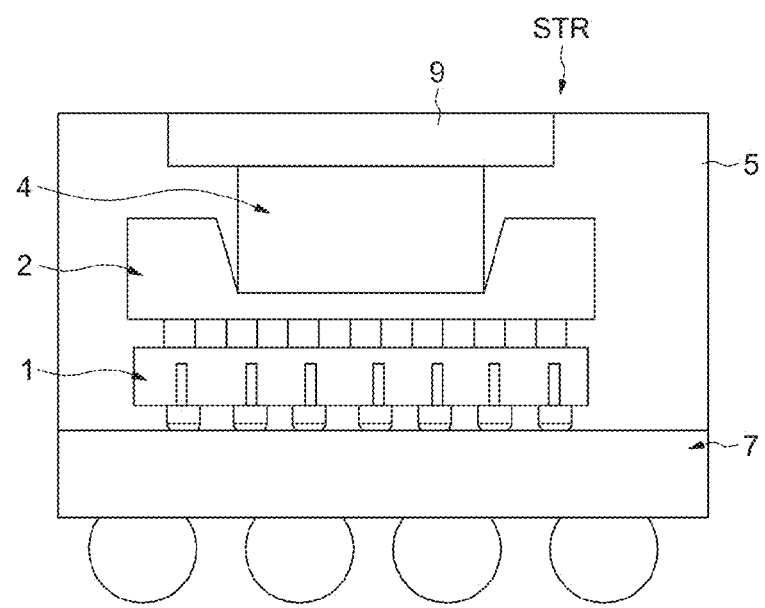

Whereas in the embodiments in FIGS. 1 and 8, the heat dissipating housing 4 was disposed between the chip 1 and the support 7, it is now disposed in contact and on top of the upper chip 2 (FIG. 9) of the structure STR.

Here again, a cavity has been formed in the chip 2 for receiving the bottom face of the heat dissipating housing 4.

In addition, in order to further improve the heat dissipation, a means forming a radiator 9, for example a copper block, is disposed in contact with the top face of the housing 4.

Whereas the structures STR described in the preceding embodiments were three-dimensional structures, in other words they comprised a stack of at least two chips on a support, for example of the BGA type, the invention is also applicable to two-dimensional structures STR, in other words only comprising a single chip on a support. This is illustrated more particularly in FIGS. 10 and 11.

Figure 10:
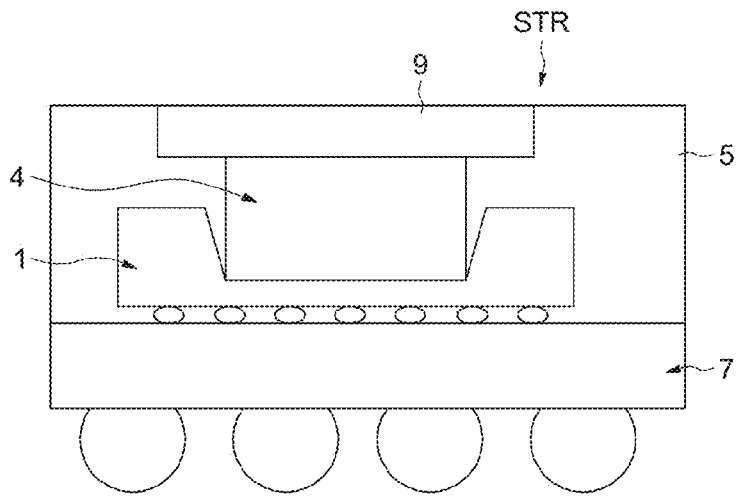

More precisely, in FIG. 10, the structure STR comprises a chip 1 in electrical contact with the support 7 and comprising a cavity receiving the heat dissipating housing 4 which is attached to the chip 1. Here again, a means forming a radiator 9 is attached to the top face of the housing 4, the whole thing being encapsulated in a resin 5.

Figure 11:
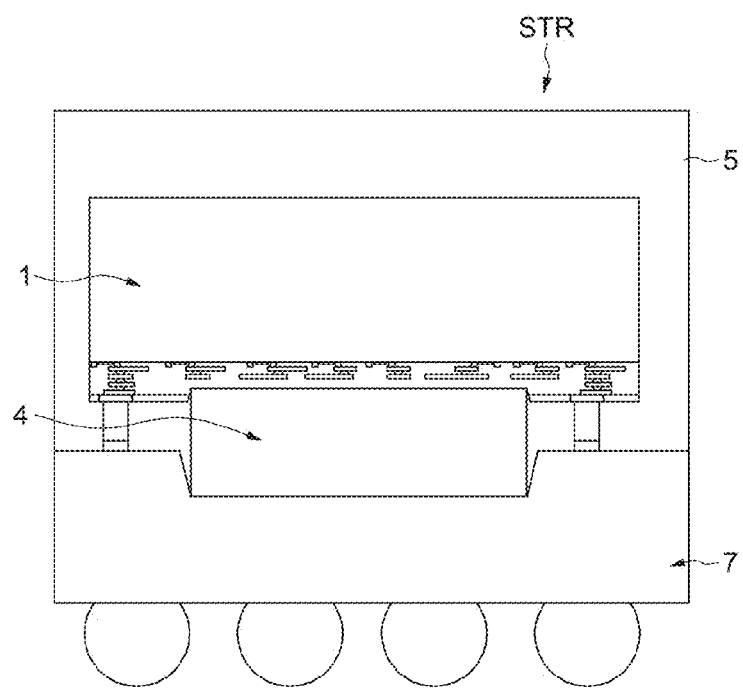

Whereas in FIG. 10 the chip 1 is situated between the heat dissipating housing 4 and the support 7, in the structure STR in FIG. 11, it is now the heat dissipating housing 4 which is disposed between the chip 1 and the support 7.

More precisely, the housing 4 is attached to the front face of the chip 1 and also rests in contact within a cavity formed in the support 7. The whole thing is also encapsulated in a resin 5.

Reference is now more particularly made to FIGS. 12 to 17 in order to describe one exemplary embodiment of a heat dissipating housing.

Figure 12:
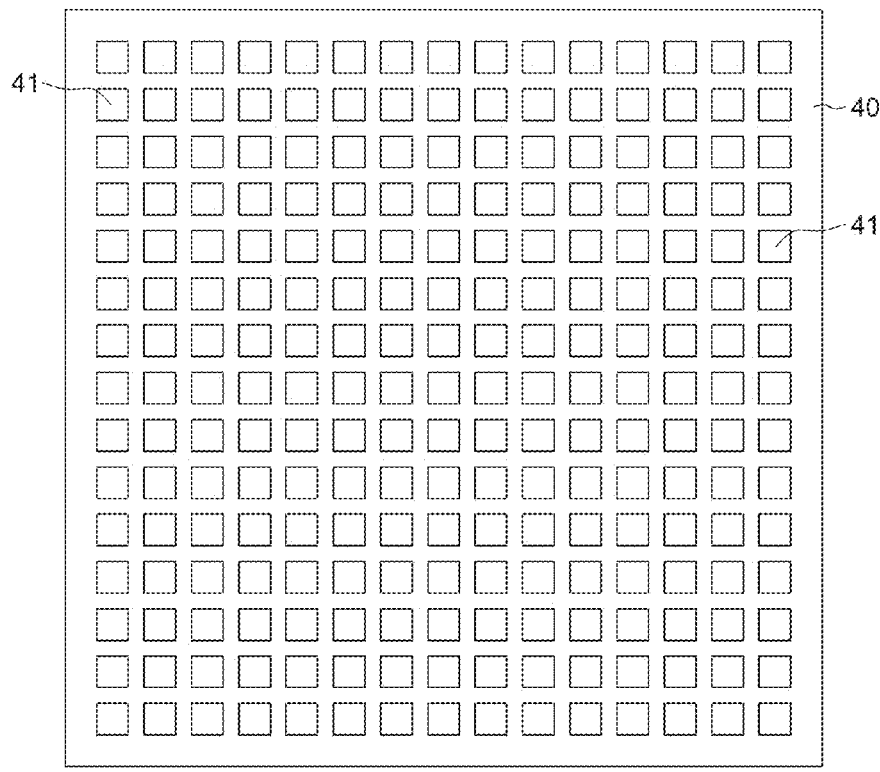
Figure 13:
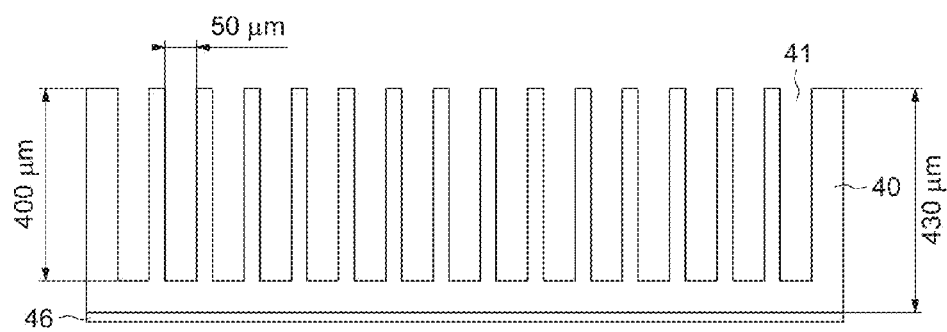

In FIGS. 12 and 13, the reference 40 denotes a substrate of silicon having for example a surface of 1 $cm^2$, thinned so as to have a height of 430 microns for example. This substrate forms part of a silicon wafer in which the lower parts of several housings will be simultaneously formed.

In a conventional manner known per se, a multitude of cavities 41 having at this stage a depth of 400 microns and a width of 50 microns are formed in this substrate 40, for example by conventional electrochemical steps.

A thermally conductive layer 46, for example a layer of aluminum nitride having for example a thickness in the range between 1 and 3 microns, typically of the order of 1 micron, is subsequently formed on the back face of the substrate 40.

This formation can conventionally be carried out by a sputter deposition (typically at 350° C.).

Aluminum nitride AlN is particularly advantageous because it exhibits high coefficients of thermal conductivity, typically 285 $W \cdot m^{-1} \cdot K^{-1}$ for a single-crystal structure and 170 $W \cdot m^{-1} \cdot K^{-1}$ for an oriented polycrystalline structure.

This is particularly advantageous when the substrate 40 of the heat dissipating housing rests, via this layer 46, on the support 7 for example.

Figure 14:
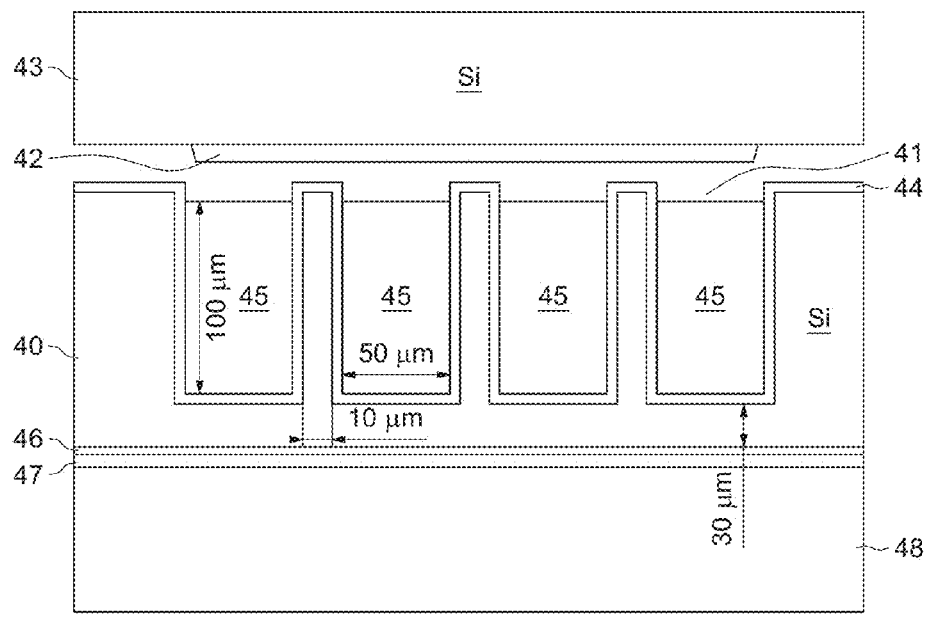

Then, as illustrated in FIG. 14, a temporary handle 48, also made of silicon, is attached to this layer 46 by means of a temporary glue 47, which handle allows the assembly to be held so as to be able to perform a thinning of the substrate 40 in FIG. 13 so as to obtain, after thinning, a height of the substrate 40 of around 130 microns and a depth of cavity 41 of around 100 microns.

The internal walls of the cavities 41 are then coated with a thermally conductive layer 44, also for example a layer of aluminum nitride. The layer 44 also extends over the top face of the substrate 40.

The cavities 41 are subsequently filled with a phase-change material, for example paraffin 45.

Figure 15:
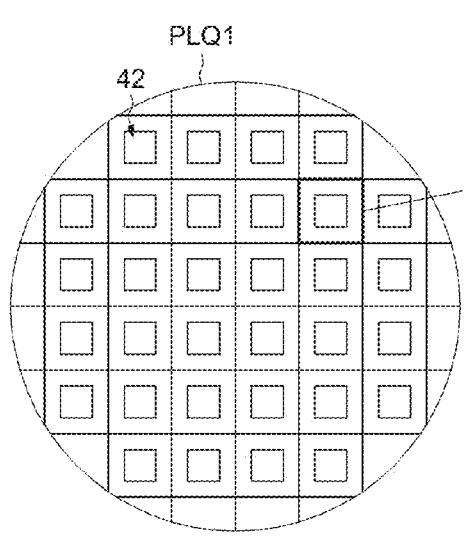
Figure 16:
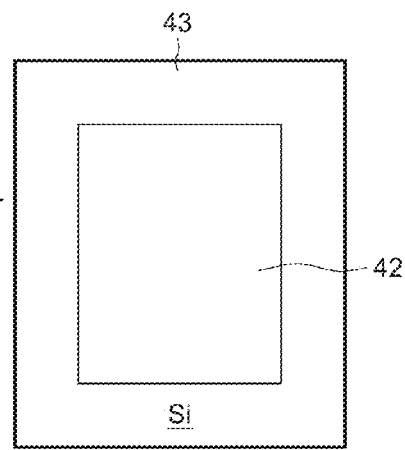

The formation of the cover 43 for the heat dissipating housing 4 is illustrated more particularly in FIGS. 15 and 16.

Thus, several covers 43 are simultaneously formed in a silicon wafer PLQ1. The formation of a cover 43 notably comprises the deposition of a thermally conductive layer, for example also aluminum nitride, over the whole face of the wafer PLQ1, then a shaping of this layer by etching operations, in such a manner as to obtain, for each cover, a layer 42 whose dimensions correspond (FIG. 14) to all of the openings of all the cavities 41.

Figure 17:
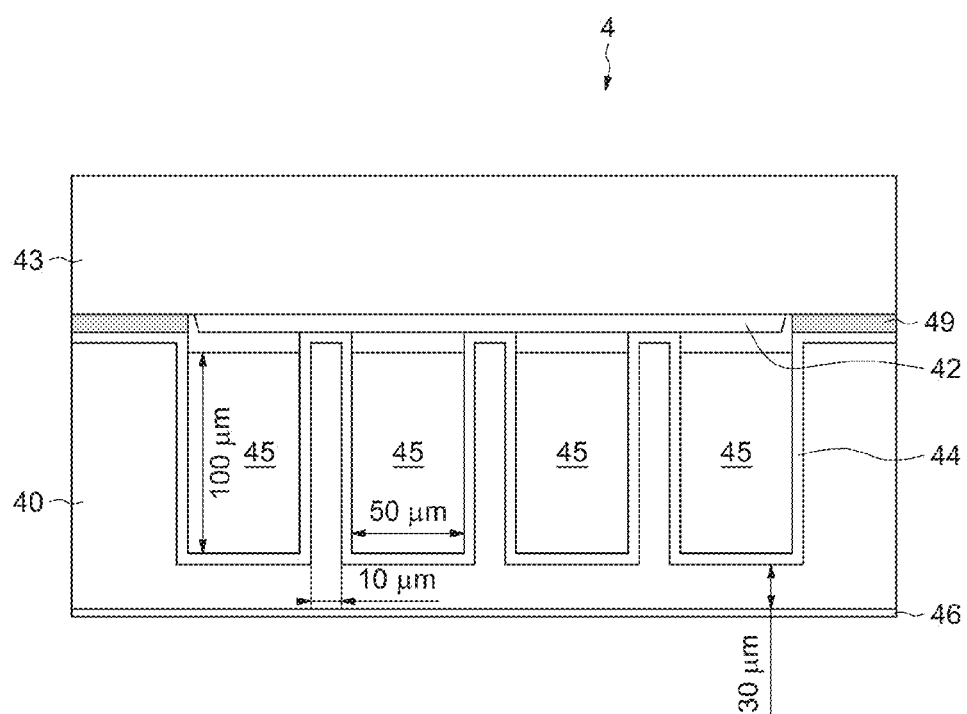

The cover 43 is then bonded onto the substrate 40 by means of an adhesive 49 (FIG. 17). After thinning of the cover 43 to a thickness of 30 microns, and after etching away of the handle 48 and of the adhesive 47 and dicing of the wafer in which the substrates 40 are formed, the heat dissipating housing 4 illustrated in FIG. 17 is obtained.

Such a housing has
a coefficient of thermal expansion equal to 3 ppm·K$^{-1}$,
a Young's modulus equal to 80 GPa,
a thermal conductivity equal to 150 W·m$^{-1}$·K$^{-1}$, and
a storage capacity in latent heat equal to 2 J.

Such a heat dissipating housing is therefore perfectly compatible, notably in terms of thermal expansion, with the chip to which it is designed to be attached.

What is claimed is:

1. An integrated structure, comprising:
   integrated circuit chip having a semiconductor substrate; and
   a heat dissipating housing attached to the integrated circuit chip, the heat dissipating housing comprising a body, the body formed of a semiconductor material that is thermally conductive and has a thermal expansion compatible with the semiconductor substrate.

2. The structure according to claim 1, wherein the heat dissipating housing has a coefficient of thermal expansion in the range between 2 ppm·K$^{-1}$ and 5 ppm·K$^{-1}$.

3. The structure according to claim 1, wherein the heat dissipating housing has a Young's modulus in the range between 50 GPa and 190 GPa.

4. The structure according to claim 1, wherein the heat dissipating housing has a thermal conductivity in the range between 100 W·m$^{-1}$·K$^{-1}$ and 300 W·m$^{-1}$·K$^{-1}$.

5. The structure according to claim 1, wherein the heat dissipating housing is configured for storing heat when electronic components of the integrated circuit chip are in operation and for releasing the heat stored when the electronic components are turned off.

6. The structure according to claim 5, wherein the heat dissipating housing contains at least one phase-change material having a first phase change during which it stores heat and a second phase change during which it releases stored heat.

7. The structure according to claim 5, wherein the heat dissipating housing possesses a storage capacity in latent heat in the range between 0.5 J and 3.5 J for a volume of housing of thickness 250 microns and a cross section equal to 1 cm$^2$.

8. The structure according to claim 6, wherein the body of the heat dissipating housing is made of silicon and defines at least one cavity closed by a cover made of silicon and containing the phase-change material.

9. The structure according to claim 8, wherein the at least one cavity and an internal face of the cover are coated with a thermally conductive layer.

10. The structure according to claim 1, wherein the heat dissipating housing is fixed into an open cavity of the integrated circuit chip formed on one of its faces.

11. The structure according to claim 1, in which the heat dissipating housing is disposed between the at least one integrated circuit chip and a substrate while being in contact with the substrate.

12. The structure according to claim 11, further comprising a thermally conductive layer situated at an interface between the body of the heat dissipating housing and the substrate.

13. The structure according to claim 1, wherein the integrated circuit chip is situated between a substrate and the heat dissipating housing.

14. The structure according to claim 1, further comprising another integrated circuit chip stacked on the integrated circuit chip on an opposite side from the heat dissipating housing.

15. The structure according to claim 1, further comprising a radiator in contact with a face of the heat dissipating housing on an opposite side from the integrated circuit chip.

16. The structure of claim 1 wherein the semiconductor substrate is formed of the semiconductor material.

17. An integrated structure, comprising:
   an integrated circuit chip including a semiconductor substrate having a front side with an interconnection network and a back side with a formed cavity; and
   a heat dissipating structure attached to the integrated circuit chip within said cavity on the back side, the heat dissipating structure being thermally conductive and having a thermal expansion compatible with the semiconductor substrate.

18. The structure according to claim 17, wherein the heat dissipating structure comprises a body made of silicon possessing at least one cavity closed by a cover made of silicon, said at least one cavity containing a phase-change material.

19. The structure according to claim 17, further comprising a thermally conductive layer situated at an interface between the heat dissipating structure and the cavity of the integrated circuit chip.

20. An integrated structure, comprising:
   an integrated circuit chip having a front side with an interconnection network and a back side;
   a heat dissipating structure attached to the interconnection network on the front side of the integrated circuit chip, the heat dissipating structure being thermally conductive and having a thermal expansion compatible with the integrated circuit chip; and
   wherein the heat dissipating structure comprises a body made of a semiconductor material possessing at least one cavity closed by a cover.

21. The structure according to claim 20, wherein the cover is made of the semiconductor material and the semiconductor material is silicon, said at least one cavity containing a phase-change material.

22. The structure of claim 20 wherein the integrated circuit chip comprises a substrate formed of the semiconductor material.

23. An integrated structure, comprising:
   an integrated circuit chip having a front side with an interconnection network and a back side;
   a heat dissipating structure attached to the interconnection network on the front side of the integrated circuit chip, the heat dissipating structure being thermally conductive and having a thermal expansion compatible with the integrated circuit chip; and
   wherein the heat dissipating structure comprises a body made of silicon possessing at least one cavity closed by a cover made of silicon, said at least one cavity containing a phase-change material.

24. The structure according to claim 23, wherein the at least one cavity and an internal face of the cover are coated with a thermally conductive layer.

25. An integrated structure, comprising:
   a substrate supporting at least one integrated circuit chip; and
   a heat dissipating housing attached to the integrated circuit chip, the heat dissipating housing being thermally conductive and having a thermal expansion compatible with the integrated circuit chip;
   wherein the heat dissipating housing comprises a body made of silicon possessing at least one cavity closed by a cover made of silicon and containing the phase-change material.

26. The structure according to claim 25, wherein the at least one cavity and an internal face of the cover are coated with a thermally conductive layer.

27. An integrated structure, comprising:
- an integrated circuit chip having a front side with an interconnection network and a back side with a formed cavity; and
- a heat dissipating structure attached to the integrated circuit chip within said cavity on the back side, the heat dissipating structure being thermally conductive and having a thermal expansion compatible with the integrated circuit chip;
- wherein the heat dissipating structure comprises a body made of silicon possessing at least one cavity closed by a cover made of silicon, said at least one cavity containing a phase-change material.

\* \* \* \* \*

UNITED STATES PATENT AND TRADEMARK OFFICE
CERTIFICATE OF CORRECTION

PATENT NO. : 9,520,334 B2  
APPLICATION NO. : 14/155007  
DATED : December 13, 2016  
INVENTOR(S) : Laurent-Luc Chapelon et al.

Page 1 of 1

It is certified that error appears in the above-identified patent and that said Letters Patent is hereby corrected as shown below:

On the Title Page

At Item (71), please correct the named Applicants as follows:

(71) Applicants: STMicroelectronics SA, Montrouge (FR);
STMicroelectronics (Crolles 2) SAS, Crolles (FR)

Signed and Sealed this
Twenty-eighth Day of February, 2017

Michelle K. Lee
*Director of the United States Patent and Trademark Office*